United States Patent [19]

Matsunaga et al.

[11] Patent Number: 5,093,712
[45] Date of Patent: Mar. 3, 1992

[54] RESIN-SEALED SEMICONDUCTOR DEVICE

[75] Inventors: Yoshihiro Matsunaga; Tadao Nishimori; Hiromasa Matsuoka; Kozo Shimamoto; Kiyoaki Tsumura, all of Hyogo, Japan

[73] Assignee: Mitsubishi Denki Kabushiki Kaisha, Tokyo, Japan

[21] Appl. No.: 611,585

[22] Filed: Nov. 13, 1990

[30] Foreign Application Priority Data

Nov. 15, 1989 [JP] Japan .................. 1-297934

[51] Int. Cl.⁵ .................... H01L 23/28; H01L 23/12
[52] U.S. Cl. ........................ 357/72; 357/74; 357/73
[58] Field of Search ............ 357/51, 73, 59, 72, 357/74, 78; 525/482; 523/433

[56] References Cited

U.S. PATENT DOCUMENTS

| | | | |
|---|---|---|---|
| 4,529,755 | 7/1985 | Nishikawa et al. | 523/436 |
| 4,614,963 | 9/1986 | Brettle et al. | 357/72 |
| 4,617,584 | 10/1986 | Ikeya et al. | 357/72 |
| 4,719,502 | 1/1988 | Ikeya et al. | 357/72 |
| 4,876,298 | 10/1989 | Itoh et al. | 523/433 |
| 4,902,732 | 2/1990 | Itoh et al. | 525/433 |
| 4,965,657 | 10/1990 | Ogata et al. | 357/72 |
| 5,008,350 | 4/1991 | Saito et al. | 525/507 |

FOREIGN PATENT DOCUMENTS

| | | |
|---|---|---|
| 0120981A1 | 10/1984 | European Pat. Off. . |
| 60-38847 | 2/1985 | Japan . |
| 60-84322 | 5/1985 | Japan . |
| 60-80259 | 8/1985 | Japan . |
| 60-190453 | 9/1985 | Japan . |
| 61-19625 | 1/1986 | Japan . |
| 62-150860 | 7/1987 | Japan . |
| 62-207319 | 9/1987 | Japan . |
| 62-285912 | 12/1987 | Japan . |
| 63-17925 | 1/1988 | Japan . |
| 1252601 | 11/1971 | United Kingdom . |
| 1549103 | 7/1979 | United Kingdom . |
| 2095268A | 1/1981 | United Kingdom . |
| 2087159A | 10/1981 | United Kingdom . |

Primary Examiner—Andrew J. James
Assistant Examiner—Don Monin
Attorney, Agent, or Firm—Lowe, Price, LeBlanc & Becker

[57] ABSTRACT

A semiconductor device sealed with resin is disclosed. This semiconductor device comprises a semiconductor element, a lead, and a wire electrically connecting said semiconductor element and said lead. The semiconductor element, the wire, and a portion of the lead are sealed with sealing resin. Calcium hydroxide is added into the sealing resin to serve as a corrosion inhibitor. In the semiconductor device sealed with resin, corrosion of the copper wire can thus be suppressed in high temperature environments.

7 Claims, 3 Drawing Sheets

RESIN-SEALED SEMICONDUCTOR DEVICE

BACKGROUND OF THE INVENTION

1. Field of the Invention

The present invention relates generally to semiconductor devices sealed with resin, and more particularly, to a resin-sealed semiconductor device improved so as to prevent corrosion of the copper wire connecting the semiconductor element and the lead.

2. Description of the Background Art

FIG. 1 is a sectional view of a resin-sealed semiconductor device. A semiconductor element 4 is fixed onto dipad 5 by cement 6 such as of solder or resin. An aluminum electrode pad 41 is provided at a portion of semiconductor element 4. Lead 8 is disposed in the vicinity of semiconductor element 4. Lead 8 and aluminum electrode pad 41 are electrically connected by copper wire 7. Dipad 5, semiconductor element 4, copper wire 7, and one portion of lead 8 are sealed by an epoxy resin composition 9.

A conventional resin-sealed semiconductor device with the aforementioned structure has the following problems. A gap is generated between epoxy resin composition 9 for sealing and lead 8. A gap is also generated at the interface between epoxy resin composition 9 and semiconductor element 4. Through this gap, external moisture enters to corrode aluminum electrode pad 41 on semiconductor element 4 and copper wire 7. This corrosion causes deficiencies such as disconnection of copper wire 7.

The cause of this corrosion is said to result from the interaction of the above mentioned moisture and ionic impurities included in the resin, and the presence of organic acid included in the resin.

In a conventional resin-sealed type semiconductor device, epoxy resin composition superior in heat resistance and moisture resistance is used as the sealing agent. Chloride ions mixed in at the time of manufacturing, or bromine derived from the brominated epoxy resin used as a flame retarder is included in the epoxy resin. This halogen interacts with the moisture entering the sealing resin while diffusing to corrode the aluminum wire of the semiconductor device.

The organic acid in the sealing resin such as formic acid and acetic acid are known to corrode the aluminum wire.

Various methods have been proposed to suppress the above mentioned corrosion of aluminum wires.

Japanese Patent Laying-Open No. 60-38847 discloses a resin-sealed type semiconductor device in which the concentration of organic acid ion such as formic acid and acetic acid is less than 20 ppm. This is a proposal to prevent corrosion of aluminum wire by decreasing the organic acid ions in the resin.

Japanese Patent Laying-Open No. 60-80259 discloses a semiconductor device sealed with a resin composition including polyfunctional epoxy compound and molybdate.

Japanese Patent Laying-Open No. 60-84322 discloses a resin composition including polyfunctional epoxy compound and biphenyl tetracarboxylic acid anhydride for sealing semiconductors.

Japanese Patent Laying-Open No. 62-150860 discloses a semiconductor device having the semiconductor element and lead wires coated by a material including a certain organic phosphate or amine type compounds.

Japanese Patent Laying-Open No. 62-207319 discloses flame retarding epoxy resin composition including bismuth type inorganic ion-exchanger and brominated epoxy resin for sealing the semiconductor device.

Japanese Patent Laying-Open No. 62-285912 discloses a resin composition including ion catcher which captures halogen ions, alkali metal ions, and organic acid ions for sealing the semiconductor.

Japanese Patent Laying-Open No. 63-17925 discloses an epoxy resin composition including silver salt of organic acid and/or lead salt of organic acid for sealing the semiconductor.

Japanese Patent Laying-Open No. 61-19625 discloses an epoxy resin composition adding hydrotalcite type compound for sealing the semiconductor.

Japanese Patent Laying-Open No. 60-190453 discloses a resin composition including ferric acid, zirconic acid, titanic acid, and hydrated bismuth trioxide acid for sealing the semiconductor.

All the above mentioned prior art achieves the suppression of aluminum wire corrosion in relatively low temperature, and suppression regarding the occurrence of aluminum wire corrosion in an environment of high temperature is not mentioned anywhere.

Because a semiconductor device generates heat when used, the temperature of the entire device rises. This rise in temperature has a great effect on the reliability of the semiconductor device. Because gold wire was used as the lead in conventional semiconductor devices, there was no corrosion in the gold wire and at the junction of the gold wire and the aluminum electrode pad even in an environment of high temperature. Hence, there was no inconvenience. However, when more economical copper wire is used instead of gold wire, the problem of corrosion in the copper wire occurs at high temperatures (170°–220° C.).

SUMMARY OF THE INVENTION

In view of the foregoing, an object of the present invention is to provide a resin-sealed semiconductor device superior in heat resistance and moisture resistance in an environment of high temperature.

Another object of the present invention is to provide a resin-sealed type semiconductor device improved so that there is no corrosion in the wire electrically connecting the semiconductor element and the lead in a high temperature environment.

A further object of the present invention is to provide a resin-sealed type semiconductor device improved so that the copper wire electrically connecting the semiconductor element and the lead does not corrode in a high temperature environment.

A still further object of the present invention is to provide a resin-sealed type semiconductor device improved so that the aluminum wire included in the semiconductor element does not corrode in a high temperature environment.

The present inventors continued the study for many years to solve the corrosion of the copper wire occurring when copper wire is used instead of gold wire in a resin-sealed type semiconductor device. The inventors made surveys of the cause of copper wire corrosion at high temperature environment. They discovered that the sealing resin composition is oxidized by the oxygen in air to generate organic acid such as formic acid, acetic acid, and lactic acid, in addition to bromine in the flame retarder being liberated as free bromine. With organic acid acting as electrolytes, and halogen ions acting as an accelerator existing as free bromine and impurities, corrosion occurs in copper wire and at the junction of the copper wire and aluminum electrode. It was also appreciated that the corrosion of copper wire at high temperature environment could not be solved with the above mentioned prior art. From the foregoing, the inventors have completed the present invention.

The present invention is directed to an improved semiconductor device sealed with resin. The inventive device comprises a semiconductor element, a lead, a wire electrically connecting the semiconductor element and the lead, and a sealing resin for enclosing and sealing the semiconductor element, the wire and a portion of the lead.

For the purpose of solving the above mentioned problem, a corrosion inhibitor comprising calcium hydroxide is added to the sealing resin.

In accordance with a preferable embodiment of the present invention, the abovementioned corrosion inhibitor is added 0.1-20% by weight into the sealing resin.

Although not verified, the acting effect of the present invention is considered as in the following. Lead oxide, calcium hydroxide, and zinc oxide added to the sealing resin reacted with the organic acid generated by oxidation from the sealing resin composition to become non electrolyte organic acid salts. Although copper has the catalytic ability to decompose and deteriorate flame retarding epoxy resin in the sealing resin, the deposited organic acid salt covers the surface of this copper. This suppresses the catalysis of copper to reduce free bromine. It is considered that the abovementioned reaction suppresses the corrosion of copper wire.

The foregoing and other objects, features, aspects and advantages of the present invention will become more apparent from the following detailed description of the present invention when taken in conjunction with accompanying drawings

DESCRIPTION OF THE PREFERRED EMBODIMENTS

The present invention will be explained with reference to embodiment examples and comparison examples.

Figure 1:
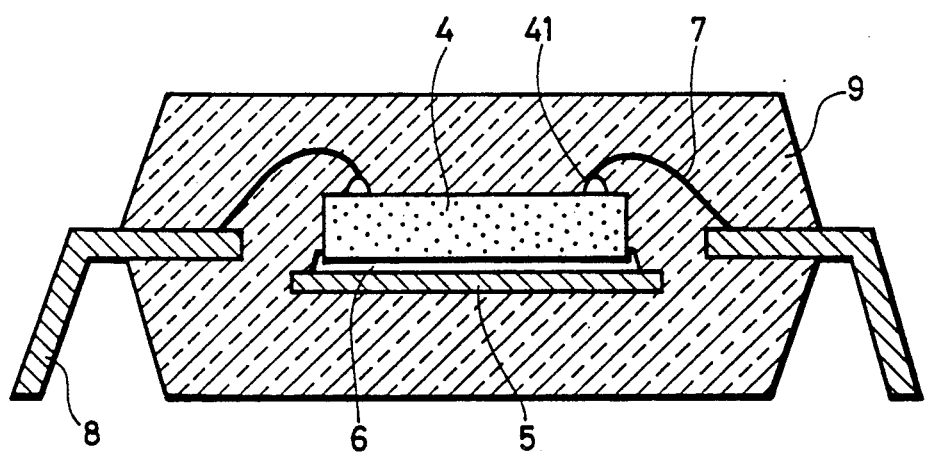
FIG. 1 is a sectional view of a resin-sealed type semiconductor device wherein the present invention is applied.

Referring to FIG. 1, semiconductor element 4 is fixed above dipad 5 by cement 6 such as of solder or resin. A portion of semiconductor element 4 is provided with aluminum electrode pad 41. Lead 8 is disposed in the vicinity of semiconductor element 4. Lead 8 is formed of iron-nickel alloy or iron-copper alloy. Lead 8 and aluminum electrode pad 41 are electrically connected by copper wire 7. Dipad 5, semiconductor element 4, aluminum electrode pad 41, and a portion of lead 8 are sealed with epoxy resin composition 9. A corrosion inhibitor comprising calcium is added to epoxy resin composition 9. The corrosion inhibitor is added 0.1-20% by weight into the sealing resin. Epoxy resin composition 9 includes cresol novolak epoxy resin as a formation material, phenol novolak resin as a hardening agent, and triphenyl phosphine as an hardening accelerator. The hardening accelerator is added 0.3±0.01% by weight in the epoxy resin.

Table 1 summarizes the compounding ratio of the epoxy resin composition.

TABLE 1

| Items of Embodiment (Examples and Comparison Examples) | Embodiment Examples | | | | | Comparison Examples | |
|---|---|---|---|---|---|---|---|
| | I | II | III | IV | V | VI | VII |
| Cresol Novolak Resin | 60 | 60 | 60 | 60 | 60 | 60 | 60 |
| Phenol Novolak Resin | 30 | 30 | 30 | 30 | 30 | 30 | 30 |
| Triphenylphosphine | 0.3 | 0.3 | 0.3 | 0.3 | 0.3 | 0.3 | 0.3 |
| Lead Oxide | 3 | — | — | 1.5 | 1 | — | — |
| Calcium Hydroxide | — | 3 | — | 1.5 | 1 | — | — |
| Zinc Oxide | — | — | 3 | — | 1 | — | — |
| Bismuth Type Inorganic Ion-Exchanger | — | — | — | — | — | 3 | — |
| No Additives | — | — | — | — | — | — | — |

Embodiments I-V have the type nd added amount of the corrosion inhibitor changed. A comparison example VII indicates the case where the above corrosion inhibitor is not added. Comparison example VII shows the case where bismuth type inorganic ion-exchanger (Toagosei Chemical Industry Co. Ltd.: IXE600) is added. The numeric values in the table are all in weight percent.

Using the sealing resin composition of Table 1, the model ICs using copper wire are formed by transfer molding. These model ICs are placed in an electric furnace of atmospheric atmosphere for 96 hours at 220° C. After cooling, the sections of the model ICs are examined by a microscope to observe the corrosion in the copper wire, in the junction of the copper wire and aluminum pad, and in aluminum wire present within the semiconductor device. The corrosion amount is obtained by measuring the reduction in the wire diameter of the copper wire. Corrosion in the junction of the copper wire and the aluminum pad is obtained by measuring the length of the corrosion of the junction interface. Corrosion of the aluminum wire within the semiconductor device is observed as to whether there is disconnection or not. The results are shown in Table 2.

TABLE 2

| Embodiment/ Comparison Examples | Corrosion in Copper Wire (μm) | Corrosion in Junction (μm) | Corrosion in Aluminum Wire | General Judgement 1) |
| --- | --- | --- | --- | --- |
| I | Not more than 1 | Not more than 10 | No | ⊚ |
| II | Not more than 1 | Not more than 10 | No | ⊚ |
| III | Not more than 5 | Not more than 15 | No | ○ |
| IV | Not more than 1 | Not more than 10 | No | ⊚ |
| V | Not more than 1 | Not more than 10 | No | ⊚ |
| VI | Not more than 5 | Not more than 25 | No | ○ |
| VII | Not less than 14 | Not less than 70 | Yes | X |

(1) ⊚: Very Good ○: Good X: Bad

Regarding the suppressing effect of corrosion, it is appreciated from Table 2 that embodiment examples I-V are superior to comparison example VII (conventional example). Furthermore, comparing embodiment examples I-V with comparison example VII, it is appreciated that the effect of corrosion suppression of embodiment examples I-V is equal or superior to that of bismuth type inorganic ion-exchanger. An examination has also been made where at least one type out of lead oxide, calcium hydroxide, and zinc oxide in the above mentioned epoxy resin has the contents varied in the range of 0.1-20% by weight. The results were substantially similar to that of Table 2. In other words, these corrosion inhibitors are effective when added within the range of 0.1-20% by weight.

Figure 2:
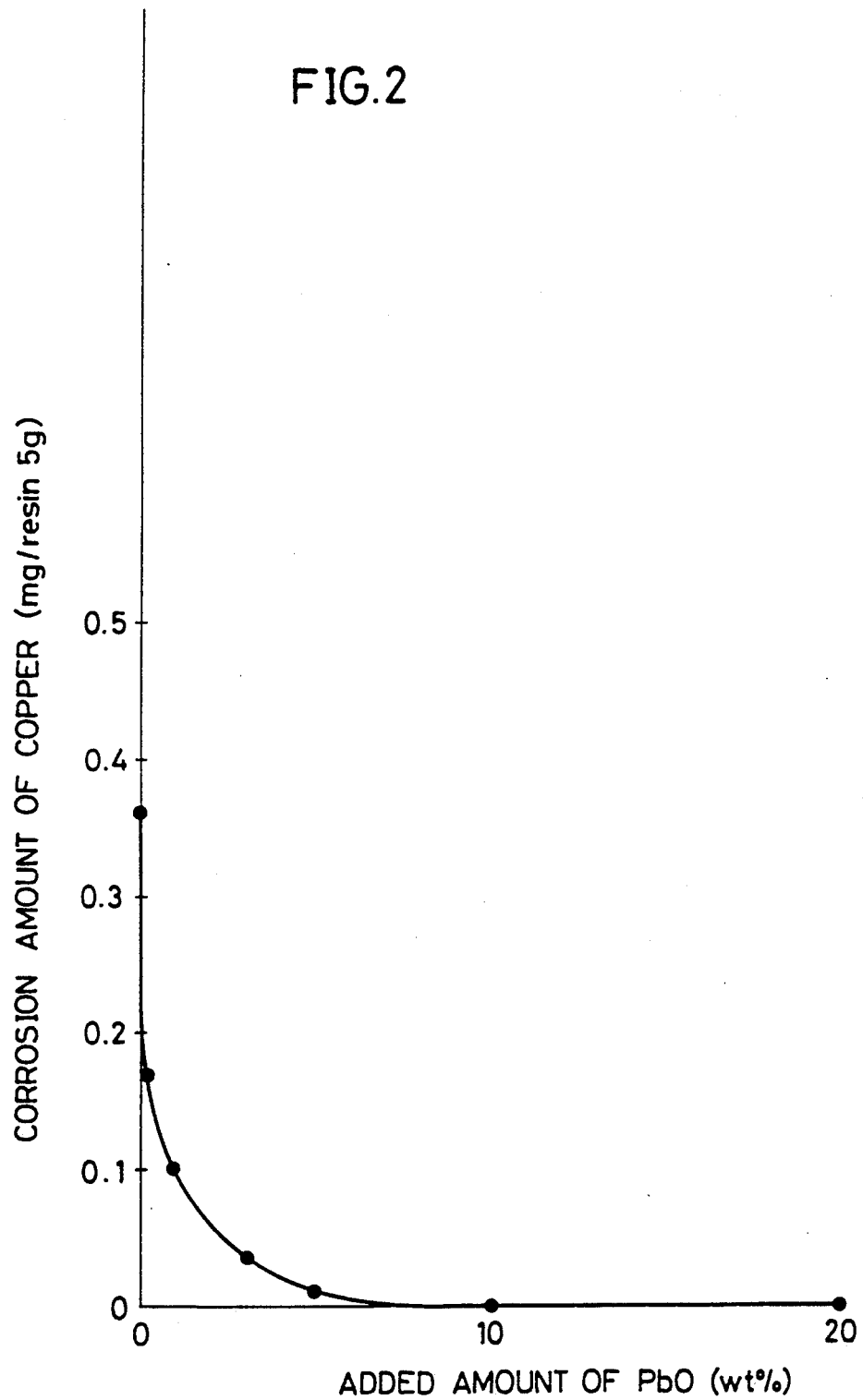
FIG. 2 is a graph showing the relation between the added amount of lead oxide and the corrosion amount of copper.

FIG. 2 is a graph showing the relation of the added amount (% by weight) of lead oxide added to the epoxy resin and the corrosion amount (mg/resin 5 g) of copper. All the specimens are formed by transfer molding, followed by being placed in an electric furnace of atmospheric atmosphere for 48 hours at 200° C. FIG. 2 shows that corrosion can be suppressed sufficiently with the added amount of lead oxide of not less than 0.1% by weight. Similar results were observed with calcium hydroxide and zinc oxide.

Figure 3:
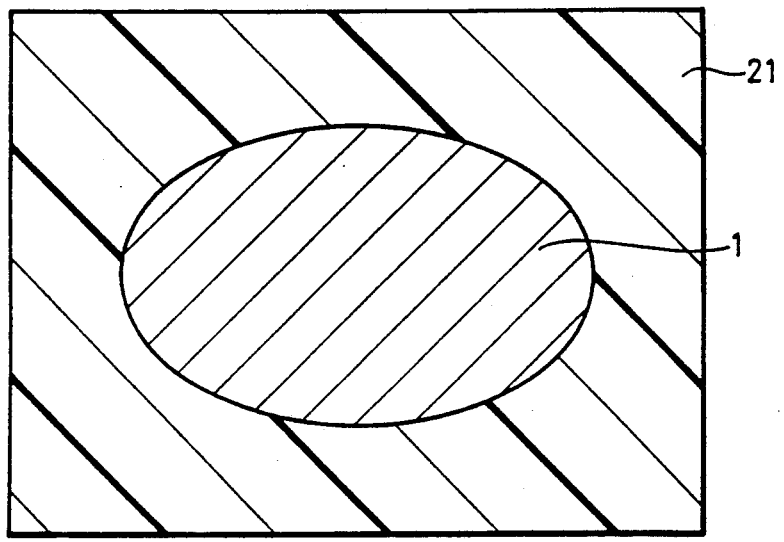
FIG. 3 is a sectional view of a copper wire in a resin-sealed type semiconductor device in accordance with the embodiment of the present invention.
Figure 4:
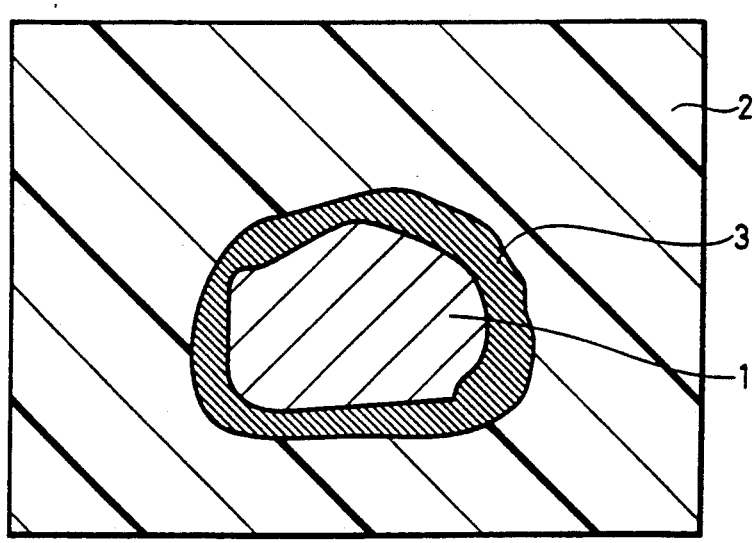
FIG. 4 is a sectional view of a copper wire in a conventional resin-sealed type semiconductor device.

FIG. 3 is a diagram produced in accordance with a micrograph (at ×100 magnification) of a section of the model IC according to embodiment example I. FIG. 4 is a diagram produced in accordance with a micrograph (at ×100 magnification) of a section of the model IC according to comparison example VII. In these figures, reference number 1 indicates copper wire, reference number 21 indicates epoxy resin having lead oxide added, reference number 2 indicates epoxy resin having no corrosion inhibitor added, and reference number 3 indicates the corrosion portion of the copper wire. Each specimen is formed with the use of mold, followed by being placed in an electric furnace of atmospheric atmosphere for 96 hours at approximately 20° C. In FIG. 3 where the sealing resin composition according to embodiment example I is used, corrosion of the copper wire was not observed. In FIG. 4 where a conventional type according to comparison example VII is used, the diameter of copper wire 1 is decreased, wherein a corrosion portion 3 of a maximum of 120 μm is observed.

As set forth throughout the foregoing description, corrosion of the copper wire can be suppressed at high temperature environment, due to the fact that corrosion inhibitor selected from the group consisting of lead oxide, calcium hydroxide, and zinc oxide is added to the sealing resin in accordance with the present invention. This results in an advantage that a resin-sealed type semiconductor device of high reliability is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device sealed with resin, comprising:
   a semiconductor element;
   a lead;
   a wire electrically connecting said semiconductor element and said lead; and
   sealing resin for enclosing and sealing said semiconductor element, said wire, and a portion of said lead,
   wherein a corrosion inhibitor comprising calcium hydroxide is added into said sealing resin.

2. The semiconductor device according to claim 1, wherein:
   said corrosion inhibitor is added into said sealing resin to be present in the range 0.1-20% by weight.

3. The semiconductor device according to claim 1, wherein:
   said sealing resin comprises an epoxy resin and a hardening accelerator.

4. The semiconductor device according to claim 3, wherein:
   said epoxy resin comprises cresol novolak epoxy resin as a formation material, and phenol novolak resin as a hardening agent; and
   said hardening accelerator comprises triphenyl phosphine.

5. A semiconductor device sealed with resin, comprising:
   a semiconductor element having an aluminum wire;
   a lead;
   a wire electrically connecting said semiconductor element and said lead; and
   sealing resin for enclosing and sealing said semiconductor element, said wire, and a portion of said lead,
   wherein a corrosion inhibitor comprising calcium hydroxide is added into said sealing resin.

6. The semiconductor device according to claim 5, wherein:
   0.1-20% by weight of said corrosion inhibitor is added into said sealing resin.

7. The semiconductor device according to claim 5, wherein:
   said sealing resin comprises an epoxy resin and a hardening accelerator.

* * * * *